United States Patent [19]
Balch et al.

[11] Patent Number: 5,317,546
[45] Date of Patent: May 31, 1994

[54] TIME-OF-USE CALENDAR EVENTS METHOD AND APPARATUS FOR A METER REGISTER

[75] Inventors: Richard A. Balch, North Hampton; Marjorie J. Mancuso, Exeter; Susan D. Dastous, Milford, all of N.H.

[73] Assignee: General Electric Company, Schenectady, N.Y.

[21] Appl. No.: 86,190

[22] Filed: Jun. 30, 1993

Related U.S. Application Data

[63] Continuation of Ser. No. 764,874, Sep. 24, 1991, abandoned.

[51] Int. Cl.$^5$ .................. G04F 8/00; G04B 47/00; G01R 11/57; G01R 21/00
[52] U.S. Cl. ......................................... 368/9; 368/10; 368/28; 324/103 R; 324/116; 364/483
[58] Field of Search ............... 368/9, 10, 11, 28, 29; 324/116, 103, 142; 364/481–483, 492, 569, 705, 715

[56] References Cited

U.S. PATENT DOCUMENTS

| | | | |
|---|---|---|---|
| 4,187,629 | 2/1980 | Yamada | 40/109 |
| 4,283,772 | 8/1981 | Johnston | 364/900 |
| 4,355,361 | 10/1982 | Riggs et al. | |
| 4,465,970 | 8/1984 | Di Massimo et al. | 324/116 |
| 4,511,979 | 4/1985 | Amirante | |
| 4,754,217 | 6/1988 | Germer et al. | 324/116 |
| 4,792,677 | 12/1988 | Edwards et al. | |
| 4,807,154 | 2/1989 | Scully et al. | 364/518 |
| 4,807,155 | 2/1989 | Crez et al. | 364/518 |
| 4,819,191 | 4/1989 | Scully et al. | 364/518 |
| 4,852,030 | 7/1989 | Munday | 364/569 |
| 4,866,611 | 9/1989 | Crez et al. | 364/974 |
| 4,908,769 | 3/1990 | Vaughan et al. | |
| 5,040,158 | 8/1991 | Lee et al. | 368/10 |
| 5,066,906 | 11/1991 | Moore | |

FOREIGN PATENT DOCUMENTS

| | | |
|---|---|---|
| 0176338 | 10/1989 | European Pat. Off. |
| 2069153A | 5/1985 | United Kingdom |
| 82/02954 | 2/1982 | World Int. Prop. O. |

OTHER PUBLICATIONS

Sangamo Energy Management Division, Product Bulletin 10506, ST-Q100 Series, Electronic Meter, Effective Date Jun., 1987.

Sangamo Energy Management Division, Product Bulletin 10251, ST-Q120 Series, Electronic Meter, Effective Date Aug., 1987.

Sangamo Electricity Division, RV1 Multifunction Meter, Product Bulletin 10532, Effective Sep., 1989.

Scientific Columbus, JEM3, Sep. 1989.

Appalachian Technologies Corporation, SSM-SOT Four Quadrant, Time-of-Use Precision Meter, Oct. 1989.

APTECH, Inc., PFM-800 Series Multifunction Meters, Jan. 1991.

Process Systems Incorporated, The Quad 4 Solid State Meter Family, May 1991.

Trans Data, EMS 7000 Electronic Metering System with Demand Register, Publication Date Unknown, this copy obtained on May 14, 1991.

Trans Data, Inc. EMS 96 Electronic Metering System, Publication Date Unknown, this copy obtained on May 14, 1991.

ABB Type E1R Polyphase Solid-State Watthour/Varhour Meter, Sep. 1991.

Schlumberger Industries, Inc. Introducing FULCRUM Commercial/Industrial Meters, Mar. 1991.

Transmission & Distribution, May 1992, Universal Meter Introduced by ABB ...

Engineering presentation to AEIC/EEI Meter and Services Committees, Sep. 24, 1990, pp. 1–6.

European Search Report dated Jan. 11, 1993 of European Application No. 92 30 8647.

Primary Examiner—Vit W. Miska
Attorney, Agent, or Firm—Bell, Seltzer, Park & Gibson

[57] ABSTRACT

A Method and apparatus for identifying events for making changes to a meter register configuration. In the one embodiment, the method comprises the steps of storing event data, including event dates, in a meter register memory, the event data being stored in a floating date format or in a fixed date format, and processing the event data to determine whether a current date corresponds to an event date.

15 Claims, 2 Drawing Sheets

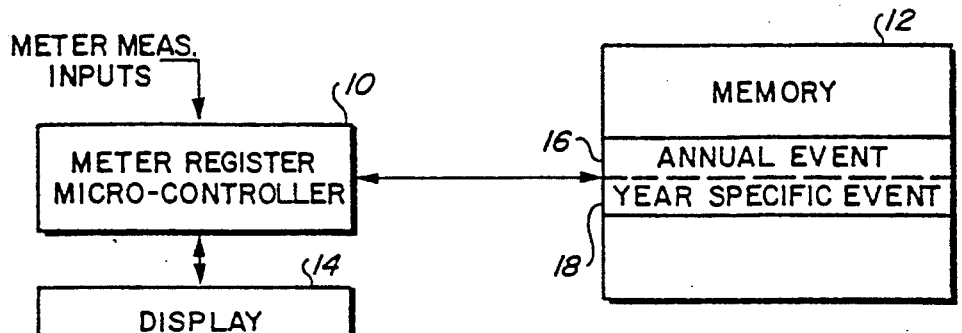

*Fig. 1*

FLOATING DATE FORMAT

BYTE 1

| 7(MSB) | 6 | 5 | 4 | 3 | 2 | 1 | 0(LSB) |
|---|---|---|---|---|---|---|---|
| DAY OF WEEK =(1-7, SUN.-SAT.) | | | FLOAT =1 | MONTH =(1-12) | | | |

BYTE 2

| SEASON CHANGE =0 FOR NO SEASON CHNG. 1-4 FOR SEASONS 1-4 | HOLIDAY =0 NO HOLIDAY =1 HOLIDAY 1 =2 HOLIDAY 2 | OCCURENCE FOR DAY OF WEEK =1 FIRST, 2 SECOND, 3 THIRD, 4 FOURTH 5 FOR LAST |
|---|---|---|

BYTE 3

| NOT USED | =1 TO MOVE OFF SAT. | =1 TO MOVE OFF SUN. | =1 FOR NEXT DAY | =1 TO INCLUDE =0 ONLY | =1 FOR PREV DAY | =1 FALL DAY- LIGHT SAVINGS | =1 SPRG. DAY- LIGHT SAVINGS |
|---|---|---|---|---|---|---|---|

BYTE 4

| NOT USED | EFFECTIVE RANGE IF YEAR SPECIFIC INDICATE YEAR =00-99 OTHERWISE = 7Fh (OR 127) |
|---|---|

*Fig. 2A*

FIXED DATE FORMAT

BYTE 1

| 7 | 6 | 5 | 4 | 3 | 2 | 1 | 0 |
|---|---|---|---|---|---|---|---|
| DAY OF MONTH (3 LSB'S) ||| FIXED =0 | MONTH =(1-12) ||||

BYTE 2

| SEASON CHANGE<br>=0 FOR NO SEASON CHNG<br>1-4 FOR SEASONS 1-4 | HOLIDAY<br>=0 NO HOLIDAY<br>=1 HOLIDAY 1<br>=2 HOLIDAY 2 | DAY OF MONTH (3 MSB'S)<br>\*IT TAKES 6 BITS TO<br>REPRESENT 1-31 |
|---|---|---|

BYTE 3

| NOT USED | =1 TO MOVE OFF SAT | =1 TO MOVE OFF SUN | =1 FOR NEXT DAY | =1 TO INCLUDE =0 ONLY | =1 FOR PREV DAY | =1 FALL DAY-LIGHT SAVINGS | =1 SPRG. DAY-LIGHT SAVINGS |
|---|---|---|---|---|---|---|---|

BYTE 4

| NOT USED | EFFECTIVE RANGE<br>IF YEAR SPECIFIC INDICATE YEAR WITH 00-99<br>OTHERWISE = 7Fh (OR 127) |
|---|---|

*FIG. 2B*

TIME-OF-USE CALENDAR EVENTS METHOD AND APPARATUS FOR A METER REGISTER

This is a continuation of copending application Ser. No. 07/764,874 filed on Sep. 24, 1991, now abandoned.

BACKGROUND OF THE INVENTION

A. Field of the Invention

The present invention generally relates to meters, and more specifically, relates to providing a programmable calendar events feature in a meter register.

B. Related Art

In known electronic time-of-use (TOU) meter registers, the register is programmed with calendar events. Calendar events specify, for example, holidays, season changes, and daylight saving changes. The number of calendar events the register can observe is limited by register memory space. Each unique event which must be observed for TOU metering requires an allocated memory space. For example, if the register is to be in the field for a ten year period, and if New Years Day is to be observed as a holiday every year, then ten calendar events for each New Years Day are stored in the register memory.

In order for the TOU register to continue proper operation beyond the period for which calendar events have been stored in the register memory, the register must be programmed with updated calendar events. As the number of programmable dates per year increases, the number of years the register can remain in the field without requiring a calendar update is shortened.

SUMMARY OF THE INVENTION

The present invention provides means for representing a single calendar event as multiple dates or a single unique date. More particularly, in one embodiment, the present invention supports two types of calendar events—annual events and year specific events. An annual event is observed by the register every year the register is in the field. Year specific events are only observed for the specified year.

By utilizing annual events, the number of calendar events required to be stored in the meter register is reduced. For example, one annual event could specify New Years Day and would result in New Years Day being observed for every year the register is in the field.

The present invention facilitates reducing the number of times a register must be programmed with updated calendar events. Moreover, calendar events can be specified with greater flexibility.

BRIEF DESCRIPTION OF THE DRAWINGS

These and other objects of the present invention, together with further features and advantages thereof, will become apparent from the following detailed specification when read together with the accompanying drawings, in which:

FIG. 1 is a block diagram illustrating one embodiment of the present invention; and FIGS. 2A-B illustrate floating date and fixed date formats, respectively.

DETAILED DESCRIPTION OF THE DRAWINGS

Referring now specifically to the drawings, FIG. 1 is a block diagram illustrating one embodiment of the present invention. Particularly, a meter register micro-controller 10 is illustrated as being coupled to a memory 12 and a display 14. In operation, such as in TOU operations, the micro-controller 10 performs a time/date keeping function and receives meter measurement inputs from a metering mechanism (not shown). As is well known in the art, the meter measurement inputs, for example, may be in the form of pulses. Each pulse is indicative of a predetermined quantum of energy which has been consumed.

The micro-controller 10 causes pulse counts to be stored in respective memory locations. For example, if a pulse is received by the micro-controller 10 during a first time period, the pulse count in a first memory location may be incremented. If another pulse is received by the micro-controller 10 during a second time period, the pulse count in a second memory location may be incremented.

To obtain the TOU information, and as is well known in the art, a meter reader couples an electronic data retrieving means to the meter. The retrieving means then reads and stores the pulse counts in the respective memory locations of the meter register. This information is then carried back by the meter reader to a central location and processed further for billing purposes.

In addition to time of day, the manner of storing pulses is dependent upon, for example, whether the particular day on which the pulse was received is a holiday or a "normal" day. The micro-controller 10 makes this determination by scanning the memory 12 at specified locations for determining whether the current date is an annual event 16 or a year specific event 18.

An annual event is an event which is to be observed for every year the register is in use. The year specific event is an event that is to be observed only during a specified year, i.e., not every year the register is in service. A year specific event is stored in the memory 12 in a format readable by the micro-controller 10.

For an annual event, a date is specified as a fixed date or a floating date. A fixed date designation is composed of a day of a month (1–31) and the month (January–December). An example of a fixed date is December 25th, Christmas. This calendar event is observed on the 25th day of each December the register is in use.

A floating date designation is composed of a day of the week (Sunday–Saturday), the occurrence of the day of the week (first, second, third, fourth, and last), and the month (January–December). An example of a floating date is the fourth Thursday of November, Thanksgiving Day. This calendar event would be observed on the forth Thursday of each November the register is in use.

In accordance with the preferred embodiment of the present invention, qualifiers are used to enhance the effectiveness of the calendar event designation. One type of qualifier allows the event to be moved to the adjacent Friday should the event fall on a Saturday, or the event is moved to the adjacent Monday should the event fall on a Sunday.

Another type of qualifier allows the event to be observed on the day preceding the specified date, or to be observed on both the preceding day and the specified day, or to be observed on the day following the specified date, or to be observed on both the specified date and the following day, or the event, alternatively, could be observed on the preceding day, the specified day, and the day following the specified day.

Other qualifiers, of course, may be used. General rules guide how combinations of qualifiers should be used. The previous and next day qualifiers, for example, should not be specified in combination with the weekend qualifiers. Season changes and day light saving changes should not be specified with multiple days. Also, only valid days of months should be specified for the specified month.

The following Table I identifies General Qualifiers, Consecutive Day Qualifiers, and Weekend Qualifiers.

TABLE 1

| General Qualifiers: | |
|---|---|
| MONTH | JANUARY-DECEMBER |
| TYPE OF DATE | FIXED OR FLOAT |
| DAY OF MONTH | 1-31 |
| | (FIXED DATE ONLY) |
| DAY OF WEEK | SUNDAY-SATURDAY |
| | (FLOAT DATE ONLY) |
| OCCURRENCE | FIRST, SECOND, THIRD, FOURTH |
| | (FLOAT DAY ONLY) |
| DAY LIGHT SAVING CHANGE | NONE, FALL, SPRING |
| HOLIDAY | HOLIDAY TYPE I, HOLIDAY TYPE II, NO HOLIDAY |
| SEASON CHANGE | SEASON 1, SEASON 2, SEASON 3, SEASON 4, NO SEASON CHANGE |
| EFFECTIVE YEARS | 00-99, ALL |
| Consecutive Day Qualifiers: | |
| SELECT PREVIOUS DAY | YES, NO |
| SELECT NEXT DAY | YES, NO |
| CONSECUTIVE DAY TYPE | INCLUDE, ONLY |
| Weekend Qualifiers: | |
| MOVE FROM SATURDAY | YES, NO |
| MOVE FROM SUNDAY | YES, NO |

FIGS. 2A-B illustrate a format for storing the floating date and the fixed date, respectively, in the memory 12. Each entry is composed of four bytes, The format of the four bytes is different for floating dates and the fixed dates as indicated in the figures. Byte four (4) of both floating and fixed date formats indicates whether the date is year specific.

Prior to operation, the dates are stored in the memory 12. The dates preferably are stored in chronological sequence so that the earliest date in January appears at the beginning and the latest date in December appears at the end of the memory block.

Once the date information is stored, and when the meter is in use, the micro-controller 10 operates as follows. A block of memory (referred to herein as the fixed date table) capable of storing, for example, information for four dates is specified. The micro-controller 10 determines, for each day the meter is in use, the day and time, i.e., the micro-controller 10 "knows" the current date. The micro-controller 10 then loads the fixed date table with the next four dates, and corresponding data, on which an event is to occur.

Particularly, the micro-controller 10 scans the first four bits (month data) of the first byte of the floating date and fixed date data. If the month of a floating date or fixed date corresponds to the current month, then the micro-controller 10, knowing the current date and day of week, determines the date and day of week for the floating date.

Starting from the current date, the micro-controller 10 then loads the fixed date table with the data for the next four (4) events. A pointer may be used to indicate where the last date was located in the memory 12 so that when subsequent dates are to be loaded into the fixed date table, rather than scanning each data entry, the micro-controller 10 can immediately proceed to the data entry at the pointer location.

If the fixed date table is not completely loaded using the dates for the current month, then dates for the next month are scanned and processed. This process is repeated until the fixed date table is loaded, i.e., until four (4) dates/events are designated in the fixed date table.

Just after midnight and for each day, the micro-controller compares the current date with the dates in the fixed date table. When a match between a date in the fixed date table and the current date occurs, then the micro-controller 10 scans event bits to determine if the TOU schedule must be changed (holiday or season change bits) and/or whether a daylight savings change is to occur.

Once a date in the fixed date table is used, then the process hereinbefore explained, beginning at the location of the pointer, is repeated to find the next date/event to load into the fixed date table.

While the present invention has been described with respect to specific embodiments, many modifications, variations, substitutions, and equivalents will be apparent to those skilled in the art. Accordingly, the invention is to be considered as limited only by the spirit and scope of the appended claims.

What is claimed is:

1. A method of measuring time-of-use of electric energy consumed by an end user coupled to a power delivery system, the time-of-use measuring method comprising the steps of:
    formatting data within a storage device relating to a plurality of calendar events, including year specific calendar events and annual calendar events, said formatting step comprising the steps of:
        formatting the corresponding months of said year specific calendar events;
        formatting the corresponding days of the week of said year specific calendar events; and
        formatting the occurrence numbers of the days of the week of said year specific calendar events; and associating a time-of-use function with each year specific calendar event;
    comparing a calendar date to the formatted month, the formatted day of the week and the formatted occurrence number of at least one of said year specific calendar events, to determine whether the calendar date matches a a year specific calendar date;
    receiving signals indicative of an amount of energy consumed by an end user from a power delivery system; and
    processing the received signals based upon the time-of-use function associated with the matched year specific calendar event.

2. The time-of-use measuring method of claim 1;
    wherein said formatting step further comprises the steps of:
        formatting the corresponding months of said annual calendar events;
        formatting the corresponding days of the month of said annual calendar events; and associating a time-of-use function with each annual calendar event;
    wherein said comparing step further comprises the step of comparing said calendar date to the formatted month and the formatted day of the month of at least one of said annual calendar events to determine whether the calendar date matches an annual calendar event; and wherein said processing step further comprises the step of processing the received signals based upon the time-of-use function associated with the matched annual calendar event.

3. The time-of-use measuring method of claim 1 wherein the event data for each calendar event is stored chronologically.

4. The time-of-use measuring method of claim 1 wherein said comparing step comprises the steps of:
loading a table with at least the month, the day of the week and the occurrence number of the day of the week of at least a next event to be observed; and
comparing the calendar date with the at least a next event in said table.

5. The time-of-use measuring method of claim 4 wherein at least the next four events to be observed are loaded into said table.

6. The time-of-use measuring method of claim 1 wherein said occurrence number corresponds to one of a first, second, third, fourth or fifth occurrence of the associated day of week in the associated month.

7. A time-of-use electric meter which measured energy consumed by an end user coupled to a power delivery system, the time-of-use electric meter comprising:
means for retaining a plurality of year specific calendar events in floating date format, said floating date format retaining means including:
first memory means for retaining the corresponding months of said year specific calendar events;
second memory means for retaining the corresponding days of the week of said year specific calendar events; and
third member means for retaining the occurrence numbers of the days of the week of said year specific calendar events;
means for comparing a calendar date to the month, the day of the week and the occurrence number of at least one of said year specific calendar events in said first memory means, said second memory means and said third memory means, respectively, to determine whether the calendar date matches said at least one of said year specific calendar events;
means for receiving signals indicative of an amount of energy consumed by an end user from the power delivery system during the calendar date; and
means for selectively processing the received signals if the calendar date matches said at least one of said year specific calendar events.

8. The time-of-use electric meter of claim 7 further comprising means for retaining a plurality of annual calendar events in fixed date format, said fixed date format retaining means including:
fourth memory means for retaining the corresponding months of said annual calendar events; and
fifth memory means for retaining the corresponding days of the month of said annual calendar events; and
wherein said calendar date comparing means further comprises means for comparing the calendar date to the month and the day of the month of at least one of said annual calendar events to determine whether the calendar date matches said at least one of said annual calendar events; and wherein said processing means further comprises means for selectively processing the received signals if the calendar date matches said at least one of said annual calendar events.

9. The time-of-use electric meter of claim 7 wherein the event data for each calendar event is stored chronologically.

10. The time-of-use meter of claim 7 wherein said comparing means comprises:
means for loading a table with at least the month, the day of the week and the occurrence number of the day of the week of at least a next event to be observed; and
means for comparing the calendar date with the at least a next event in said table.

11. The time-of-use meter of claim 10 wherein at least the next four events to be observed are loaded into said table.

12. The time-of-use electric meter of claim 7 wherein said occurrence number corresponds to one of a first, second, third, fourth or fifth occurrence of the associated day of week in the associated month.

13. A time-of-use electric meter which measures energy consumed by an end user coupled to a power delivery system, the time-of-use electric meter comprising:
memory means, in the time-of-use electric meter, for retaining a plurality of calendar events including year specific calendar events and annual calendar events in floating date format and fixed date format, respectively, said memory means including:
a first memory portion for retaining the months of said year specific calendar events and said annual calendar events;
a second memory portion for retaining the days of the week of said year specific calendar events;
a third memory portion for retaining the occurrence numbers corresponding to the days of the week of said year specific calendar events;
a fourth memory portion for retaining the days of the month of said annual calendar events; and
a fifth memory portion for retaining weekend qualifiers; and
microcontroller means, connected to said memory means, for determining whether a calendar date matches at least one of said calendar events, based on data contained in said first, second, third and fourth memory portions, said microcontroller means including:
means for receiving first signals indicative of an amount of energy consumed by an end user from a power delivery system during said calendar date;
means for selectively processing the received first signals if said calendar date matches said at least one of said calendar events;
means for receiving second signals indicative of an amount of energy consumed by an end user from a power delivery system during the day after said calendar date, if said calendar date is a Sunday, and during the day preceding said calendar date if said calendar date is a Saturday; and
means for selectively processing the received second signals, based on the data contained in said fifth memory portion.

14. The time-of-use electric meter of claim 13, wherein said memory means further includes a sixth memory portion for retaining consecutive day qualifiers including a previous day qualifier and a next day qualifier.

15. The time-of-use electric meter of claim 14, wherein said microcontroller means further includes:
means for selectively processing the received first signals if said calendar date matches the day preceding said at least one of said calendar events occurring on a weekday, based on said previous day qualifier; and
means for selectively processing the received first signals if said calendar date matches the day following said at least one of said calendar events occurring on a weekday, based on said next day qualifier.

* * * * *

UNITED STATES PATENT AND TRADEMARK OFFICE
CERTIFICATE OF CORRECTION

PATENT NO. : 5,317,546

DATED : May 31, 1994

INVENTOR(S) : Balch et al.

It is certified that error appears in the above-identified patent and that said Letters Patent is hereby corrected as shown below:

On the title page, item [56] References Cited:

UNDER "U.S. PATENT DOCUMENTS":

Reference No. 4, "Di Massimo" should be -- DiMassimo --.

Reference No. 9, "Crez" should be -- Cree --.

Reference No. 12, "Crez" should be -- Cree --.

UNDER "FOREIGN PATENT DOCUMENTS":

Reference No. 1, "10/1989" should be -- 4/1986 --.

Reference No. 2, "5/1985" should be -- 8/1981 --.

UNDER "OTHER PUBLICATIONS":

line 6, "RV1" should be -- KV1 --.

line 9, "SOT" should be -- 5OT --.

Column 1, lines 22, 24 and 46, "New Years" should be -- New Year's --.

Column 2, lines 3, 10, 12, 15, 28 and 37, "micro-controller" should be -- microcontroller --.

UNITED STATES PATENT AND TRADEMARK OFFICE
CERTIFICATE OF CORRECTION

PATENT NO. : 5,317,546
DATED : May 31, 1994
INVENTOR(S) : Balch et al.

It is certified that error appears in the above-identified patent and that said Letters Patent is hereby corrected as shown below:

Column 2, line 50, "forth" should be -- fourth --.

Column 3, line 3, "day light" should be -- daylight --.

Column 3, line 7, "Table I" should be -- Table 1 --.

Column 3, line 19, "DAY LIGHT" should be -- DAYLIGHT --.

Column 3, lines 47, 50, 52, 53, 56, 60 and 63, "micro-controller should be -- microcontroller --.

Column 4, lines 1, 8 and 12, "micro-controller" should be -- microcontroller --.

IN THE CLAIMS:

Column 4, line 48, omit one occurrence of "a".

Column 5, line 24, "measured" should be -- measures --.

UNITED STATES PATENT AND TRADEMARK OFFICE
CERTIFICATE OF CORRECTION

PATENT NO. : 5,317,546
DATED : May 31, 1994
INVENTOR(S) : Balch et al.

It is certified that error appears in the above-indentified patent and that said Letters Patent is hereby corrected as shown below:

Column 5, line 36, "member" should be --memory--.

Signed and Sealed this

Third Day of January, 1995

Attest:

BRUCE LEHMAN

*Attesting Officer*     *Commissioner of Patents and Trademarks*